(12) United States Patent
Schmid et al.

(10) Patent No.: US 8,723,164 B2
(45) Date of Patent: May 13, 2014

(54) ELECTRONIC DEVICE

(75) Inventors: Guenter Schmid, Hemhofen (DE); Ralf Krause, Erlangen (DE); Stefan Seidel, Nittendorf (DE); Oliver Weiss, Dossenheim (DE); Christoph Gaerditz, Regensburg (DE); Riikka Suhonen, Oulu (FI); Ulrich Niedermeier, Leiblfing (DE); Fryderyk Kozlowski, Erlangen (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 319 days.

(21) Appl. No.: 12/995,457

(22) PCT Filed: May 18, 2009

(86) PCT No.: PCT/DE2009/000701
§ 371 (c)(1),
(2), (4) Date: Feb. 18, 2011

(87) PCT Pub. No.: WO2009/143807
PCT Pub. Date: Dec. 3, 2009

(65) Prior Publication Data
US 2011/0291080 A1      Dec. 1, 2011

(30) Foreign Application Priority Data

May 30, 2008  (DE) .......................... 10 2008 025 920
Aug. 22, 2008  (DE) .......................... 10 2008 039 361

(51) Int. Cl.
*H01L 35/24* (2006.01)
(52) U.S. Cl.
USPC ................................... 257/40; 257/E51.001

(58) Field of Classification Search
USPC ............................................. 257/40, E51.001
See application file for complete search history.

(56) References Cited

U.S. PATENT DOCUMENTS

| | | | |
|---|---|---|---|
| 2002/0101154 | A1 | 8/2002 | Seo et al. |
| 2006/0068223 | A1 | 3/2006 | Nariyuki et al. |
| 2008/0074038 | A1 | 3/2008 | Kim et al. |
| 2008/0116536 | A1 | 5/2008 | Forrest et al. |
| 2009/0039294 | A1 | 2/2009 | Choong et al. |

FOREIGN PATENT DOCUMENTS

| | | |
|---|---|---|
| DE | 10207053396 | 2/2009 |
| JP | 2002-260861 | 9/2002 |
| JP | 2002-305085 | 10/2002 |
| JP | 2002-313583 | 10/2002 |
| JP | 2004-526284 | 8/2004 |
| JP | 2005-108726 | 4/2005 |
| JP | 2005-108727 | 4/2005 |
| JP | 2005-514754 | 5/2005 |
| JP | 2006-128636 | 5/2006 |
| JP | 2006-165525 | 6/2006 |

(Continued)

OTHER PUBLICATIONS

Männing, Bert, "Organische p-I-n Solarzellen" (English translation of relevant pages), Dissertation; Dresden 2004.

(Continued)

*Primary Examiner* — Anthony Ho
(74) *Attorney, Agent, or Firm* — Cozen O'Connor

(57) ABSTRACT

An electronic device comprising a substrate, a first electrode, at least one organic functional layer, and a second electrode is indicated. The organic functional layer comprises a first, a second, and a third matrix material, wherein the first matrix material has a larger band gap than the second and the third matrix materials.

16 Claims, 5 Drawing Sheets

(56) References Cited

FOREIGN PATENT DOCUMENTS

| JP | 2006-228936 | 8/2006 |
|----|-------------|--------|
| JP | 2010-510675 | 4/2010 |
| TW | 543342 | 7/2003 |
| TW | 200746898 | 12/2007 |
| WO | WO 02/074015 | 9/2002 |
| WO | WO 2006/038020 | 4/2006 |
| WO | WO 2007/070257 | 6/2007 |
| WO | WO 2007/127063 | 11/2007 |
| WO | WO 2008/010915 | 1/2008 |
| WO | WO 2008/065975 | 6/2008 |

OTHER PUBLICATIONS

Miller, Allen et al., "Impurity Conduction at Low Concentrations", Physical Review, vol. 120, No. 3, Nov. 1, 1960, pp. 745-755.

Schwartz, Gregor et al., "High efficiency white organic light emitting diodes combining fluorescent and phosphorescent emitter systems", Organic Optoelectronics and Photonics II, Proc. of SPIE, vol. 6192, No. 61920Q, 2006, pp. 1-6.

Tsai, Yung-Cheng et al., "Long-lifetime, high-efficiency white organic light-emitting diodes with mixed host composing double emission layers", Applied Physics Letters, vol. 89, No. 243521, pp. 1-3.

ELECTRONIC DEVICE

RELATED APPLICATIONS

This is a U.S. national stage of application No. PCT/DE2009/000701, filed on May 18, 2009.

This patent application claims the priorities of German Patent Application 10 2008 025 920.9 filed May 30, 2008 and German Patent Application 10 2008 039 361.4 filed Aug. 22, 2008, the disclosure content of both of which is hereby incorporated by reference.

FIELD OF THE INVENTION

The invention concerns an electronic device and a method for the production of an electronic device.

BACKGROUND OF THE INVENTION

Electronic devices, such as organic light-emitting diodes (OLEDs), consist of a sequence of several functional organic layers. Emission layers thereby have a matrix material, which is doped with emitter molecules. In the emission layer, excitons are formed by a recombination of electrons and "holes," which lead to light emission. In order to obtain a high efficiency of the electronic device, the ratio between electrons and "holes" which are transported in the emission layer is decisive. A nonbalanced ratio between hole and electron transport results in a low radiation efficiency of the device.

SUMMARY OF THE INVENTION

One object of the invention is to provide an electronic device with an improved charge carrier transport and an improved charge carrier balance in the organic layers and thus an increased efficiency. Another object of the invention is to provide a method for the production of an electronic device.

In accordance with an embodiment, an electronic device is provided which comprises a substrate, a first electrode, at least one organic functional layer, and a second electrode, wherein the at least one organic functional layer is disposed between the first electrode and the second electrode. For example, the first electrode can be located on the substrate; the at least one organic functional layer, on the first electrode; and the second electrode, on the at least one organic functional layer. The at least one organic functional layer has at least a first matrix material, a second matrix material, and a third matrix material, wherein the third matrix material has a Lowest Unoccupied Molecular Orbital (LUMO), which is energetically lower than the LUMO of the second matrix material and the LUMO of the first matrix material, and wherein the second matrix material has a Highest Occupied Molecular Orbital (HOMO), which is energetically higher than the HOMO of the first matrix material and the HOMO of the third matrix material. Thus, an electronic device is made available which comprises more than two different matrix materials in an organic functional layer. Three different matrix materials can be present thereby, and depending on the need, more than three also.

According to the molecular orbital theory, in one molecule there are several molecular orbitals with different energy levels, which can be occupied by the existing electrons. These molecular orbitals are occupied according to increasing energy level. The LUMO is the energetically lowest molecular orbital which is no longer occupied with an electron. The HOMO is the energetically highest molecular orbital which is still occupied with an electron.

This electronic device has an improved charge carrier transport and an improved charge carrier balance in the organic functional layer, and an adaptable ratio between the hole and electron transport. The first matrix material is selected thereby so that it has a large band gap that is, the difference between HOMO and LUMO, for example, so that its HOMO is energetically below the HOMO of the other two matrix materials, and its LUMO is energetically above the LUMO of the other two matrix materials.

Furthermore, the first matrix material can have a LUMO which is energetically higher than the LUMO of the second matrix material and the LUMO of the third matrix material, and a HOMO which is energetically lower than the HOMO of the second matrix material and the HOMO of the third matrix material.

Furthermore, the second matrix material in the electronic device can have a LUMO which is energetically higher than the LUMO of the third matrix material, and a HOMO which is energetically higher than the HOMO of the third matrix material. Thus, the first matrix material can have the largest band gap between the HOMO and the LUMO, in comparison to the second and the third matrix material, and the second matrix material has a band gap which is shifted energetically to the band gap of the third matrix material. In this way, electrons can be transported on the LUMO of the third matrix material, and holes can be transported on the HOMO of the second matrix material, since these energy levels are in each case the energetically most favorable for the individual charge transport.

The first matrix material can have a charge carrier mobility in the electronic device which is less than the charge carrier mobility of the second and the third matrix material. The first matrix material can be an Ultra Wide Band Gap (UGH) material, which has a band gap that is large in comparison to the other matrix materials. Thus, it cannot have a share in the charge carrier transport.

The second matrix material can also comprise a hole transport material, and the third matrix material can comprise an electron transport material.

The charge carrier transport—that is, the hole transport and the electron transport—depends, in particular, on the mobility of the holes or of the electrons in a material and on the position of the energy level HOMO and LUMO of the matrix materials. The HOMO and LUMO of a material are thereby responsible for the charge carrier injection.

To create a hole in the matrix, which is composed of the three matrix materials, an electron must be removed from the HOMO, for example, which is more difficult with an energetically low HOMO than with an energetically higher one. Thus, the second matrix material, which has a higher HOMO than the third matrix material, is more suitable as the hole transport material than the third matrix material. Something analogous is true for the creation of electrons in LUMOs, which is energetically favored with energetically lower LUMOs. Thus, the third matrix material, which has a lower LUMO than the second matrix material, is suitable as the electron transport material.

If holes and electrons are created, the mobility of these charge carriers in the material plays a role. Depending on how these two factors interact in a material, it is possible for a matrix material to be used as an electron transport material or as a hole transport material. The charge carrier transport of the other charge also takes place thereby, but the transport of one charge carrier is predominant. If a charge carrier transport does not take place in a matrix material, as in an embodiment of the invention in the first matrix material, then that can be attributed to the fact that charge carriers are not created or that there is no mobility of the charge carrier. In addition to the first matrix material, other matrix materials can be present in the organic functional layer which do not contribute to the charge carrier transport.

The HOMO and LUMO energy levels of a material can be measured so as to select suitable materials for a first, second, and third matrix material. Thus, the HOMO of a material can be determined by means of cyclovoltametry. The band gap—that is, the energetic difference between HOMO and LUMO—can also be determined by means of spectroscopy, in which the wavelength of the emitted light is measured, and therefrom the generated excitons and the band gap are calculated. The energy level of the LUMO is then calculated from the determined HOMO and the band gap. The HOMO can alternatively also be determined by means of photoelectron spectroscopy.

The mobility of electrons and holes can depend on the molecule distance—that is, the average distance between charge carrier-transporting molecules in the individual matrix material. Thus, the concentration of a matrix material in the mixture of several matrix materials plays a role. The first matrix material, which in comparison to the second and third matrix material has the largest band gap and the smallest charge carrier mobility, can be used to adjust the concentration of the second and the third matrix material separately from one another. Depending on the selected concentration of the second and third matrix material, the distances between the individual molecules change. The microscopic charge carrier transport depends on the molecule distance between the charge carrier-transporting molecules in the individual matrix material, so that by the adjustment of the concentration, the mobility of electrons and holes in the matrix, which has at least three matrix materials, can be absolutely adjusted separately from one another.

According to Miller and Abraham, the mobility can be determined in the following manner:

$$v_{ij} = v_0 \exp[-2\gamma a(\Delta R_{ij}/a)]|$$

In this model, a solid state body is built up, schematically seen from places i and j, on which are the charge carriers. Each place represents a localized state. The transport of a charge carrier between places i and j is represented by a resistance $R_{ij}$. The magnitude of the temperature-dependent resistance reflects thereby the spatial distance between the places and the needed activation energy for the transition. The parameter $\gamma$ stands for the decline of the electronic wave function of the charge carrier; a is the parameter for the average lattice distance. The phonon frequency v0 gives the number of the attempts of a charge carrier to get from one localized state to another localized state; it lies in the range of approximately 1013 s−1, and it takes into consideration the strength of the electron phonon coupling.

The electronic device can also have an organic functional layer, which is selected from a group that comprises emission layers, electron transport layers, hole transport layers, electron blocking layers, hole blocking layers, hole injection layers, electron injection layers, and intermediate layers. Intermediate layers is the name given to layers that are located between two emission layers. Depending on the kind of organic functional layer selected, these layers can also contain additional doping substances. The organic functional layer can be an emission layer and be doped with at least one emitter material.

Emitter materials can comprise small molecules or polymers. The concentration of the emitter material in an emission layer can be up to 10 wt %. Furthermore, the emitter material may have only a low charge carrier mobility as a result of the low concentration in the emission layer, and thus contribute only slightly to the charge carrier transport.

In the emission layer, it is also possible for two or three emitter materials to be present. The emitter materials can be selected, for example, from the green-emitting Ir(ppy)3 (tris (2-phenylpyridine)iridium(III), the red-emitting Ir(piq)3 (tris (1-phenylisoquinoline)iridium(III)), or the blue-emitting firpic (bis(3,5-difluoro-2-(2-pyridyl)phenyl(2-carboxypyridyl)iridium(III)).

The concentrations of the emitter material and the matrix materials in the organic functional layer can have a gradient within the organic functional layer. Thus, for example, the concentration of the emitter material can be higher in a first partial area of the layer than in a second partial layer.

By not doping with emitter materials, it is possible to produce transport, intermediate, and blocking layers.

It is also possible for several organic functional layers to be present in an electronic device, wherein the layers can have different functions or the same functions. For example, an electronic device can have a sequence of several functional, organic layers, which, for example, is composed of a hole injection layer, a hole transport layer, a first emission layer, an intermediate layer, a second emission layer, an electron transport layer, and an electron injection layer. Each of these layers can have a matrix, which has at least a first, a second, and a third matrix material. The matrix materials in the various organic functional layers can be selected similarly or differently in all layers.

Depending on where the emission layer is located in the layer stack of the electron device, it is possible to optimize the mobility of electrons and holes within this layer separately from one another if the emission layer has a first, a second, and a third matrix material. The mobility can also be optimized over several layers.

Even if the emission layer which has the three matrix materials is close to an anode or a cathode, the mobility of electrons and holes can be adjusted in such a way that the ratio of holes and electrons is balanced in the emission layer. Depending on which charge carrier type is to have a higher mobility, the matrix can contain a higher concentration of the individual matrix material. Thus, a high number of excitons can be formed in the emission layer, independent of the position of the emission layer of the electronic device.

If the organic functional layer is an emission layer with an emitter material, the LUMO of the emitter material can be energetically lower than the LUMO of the first, second, and third matrix material, and the HOMO of the emitter material can be energetically higher than the HOMO of the first, second, and third matrix material. Thus, the band gap between the HOMO and LUMO of the emitter material is smaller than the band gaps of the three matrix materials and, moreover, energetically is between all band gaps of all matrix materials. An ambipolar charge transport in an emission layer is thus possible.

The molecules of the second and third matrix materials preferably transport only one charge carrier type, holes or electrons; thus, no excitons are formed on them. In this way, the service life of the materials is increased, since degradation due to excitation energy cannot take place. Between the various molecules of the matrix materials, excited states (excimers) are formed which can transfer their excitation energy by energy transfer to the emitter molecules. Thus, the efficiency of the electronic device is further increased.

An electronic device can also have several emission layers, for example, in order to combine phosphorescent and fluorescent emitter materials in one device. Then, the insertion of an intermediate layer, which may have, for example, ambipolar charge transport characteristics, may be necessary. This is possible by the combination of three matrix materials.

By the adjustment of the charge carrier mobility with the aid of the three matrix materials, it is possible to purposefully influence the position of the recombination zone in an emission layer. The recombination zone can be thereby distributed within one layer or over several layers. By the introduction of the first matrix, which does not have a charge transport, within an emission layer, the absolute value of the charge carrier mobility decreases. A recombination zone, the zone in which excitons are formed, is produced therefrom, which is shifted from the borders of an emitting layer to the middle. This increases the efficiency of the device, since among other things, the nonradiating quenching of excitons is reduced and more excitons are formed in the actual emission layer instead of in the adjacent layers.

The electronic device can be a radiation-emitting device, for example, an organic light-emitting device. This light-emitting device can be an organic light-emitting diode (OLED). Furthermore, the electronic device can comprise a solar cell or a transistor.

For example, the at least one organic functional layer is located in a transistor between the first and the second electrodes. Furthermore, a third electrode is present. The electrodes can be selected from gate, source, and drain electrodes. A transistor can be used to switch or reinforce electric signals.

In a solar cell, light can be converted into electric energy. Here, the organic functional layer is situated between the first and the second electrodes, wherein at least one of the electrodes is formed transparent.

The device can have, for example, mCP (m-bis(N-carbazolylbenzene)), as the first matrix material in an organic functional layer; as a second matrix material, which can be a hole transport material, TCTA (9H-carbazole, 9,9',9''-(1,3,5-benzenetriyl)tris-(9Cl)); and as a third matrix material, which can be an electron transport material, for example, TPBi (1,3,5-tris(N-phenylbenzylimidazol-2-yl). If a matrix is to be prepared for an emission layer, the yellow emitter rubrene (5,6,11,12-tetraphenylnaphthacene) can be inserted as the emitter material, for example.

Furthermore, a method for the production of an electronic device with the characteristics described above is prepared. The method comprises the method steps A) preparation of a substrate, B) preparation of a first electrode and a second electrode, C) placement of at least one organic layer between the first electrode and the second electrode. For example, the at least one organic functional layer can be disposed on the first electrode, and the second electrode can be disposed on the organic functional layer. In method step C), at least a first matrix material, a second matrix material, and a third matrix material are simultaneously applied. The application in method step C) can take place, for example, by evaporation coating (coevaporation). By the simultaneous application, the concentration of the individual matrix material can be determined independently of the other matrix materials, so that the matrix materials can be applied in different concentrations.

DETAILED DESCRIPTION OF THE DRAWINGS

Figure 1:
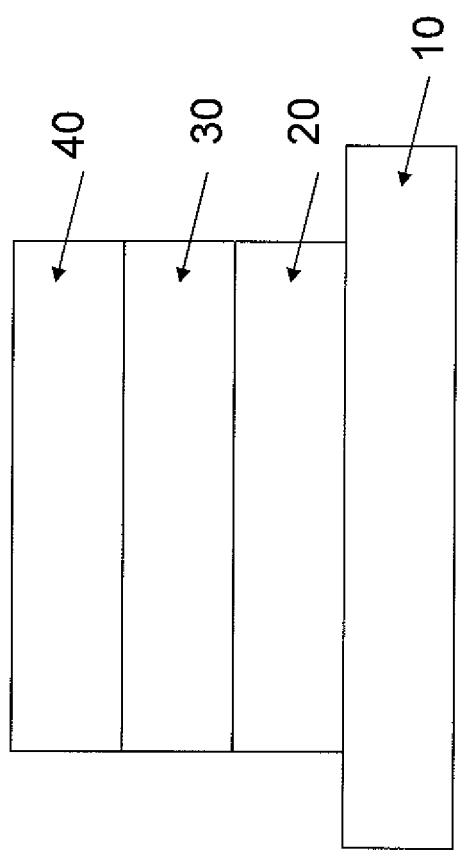
FIG. 1 shows the schematic side view of an electronic device.

FIG. 1 shows the schematic side view of an electronic device comprising a substrate 10, a first electrode 20, an emission layer 30, and a second electrode 40. The first electrode can, for example, be an anode and the second electrode, a cathode. Depending on whether the substrate and the first electrode or the second electrode are formed transparent, the electronic device may be a bottom-emitting or a top-emitting device, for example, an OLED. The emission layer 30 can have a first, a second, and a third matrix material and be doped with an emitter material.

Figure 2:
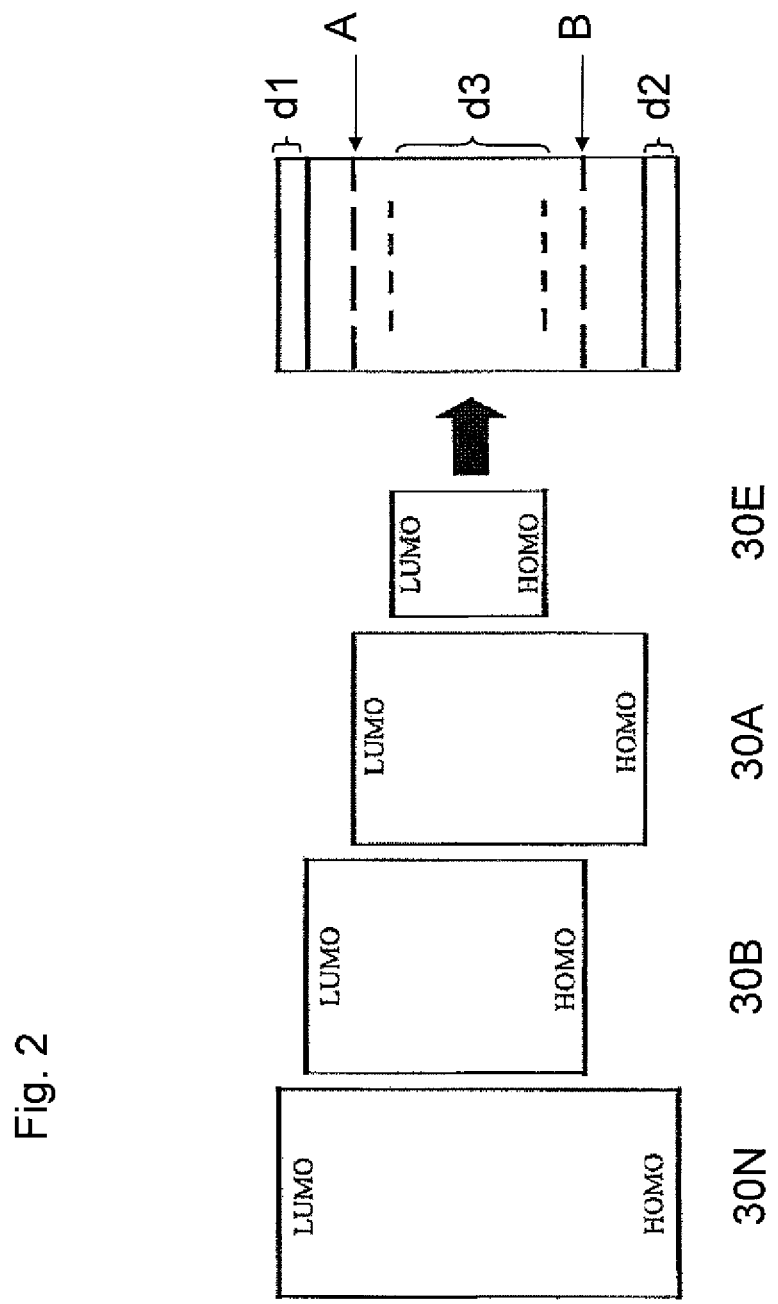
FIG. 2 shows a schematic view of the energetic states of the various matrix materials.

FIG. 2 shows the schematic representation of the energy level of the individual materials in the emission layer in an embodiment shown by way of example. The HOMO and the LUMO of the first matrix material 30N, the second matrix material 30B, and the third matrix material 30A are shown. The first matrix material has a HOMO which is energetically lower than the HOMO of the second matrix material and the third matrix material. Furthermore, the first matrix material has a LUMO which is energetically higher than the LUMO of the second matrix material and the third matrix material. The second matrix material has a LUMO which is energetically higher than the LUMO of the third matrix material, and a HOMO which is energetically higher than the HOMO of the third matrix material. Thus, the first matrix material has lower charge carrier mobilities than the other two matrix materials; the second matrix material can comprise a hole transport material, and the third matrix material an electron transport material. The emitter material 30E has a HOMO and LUMO which has the smallest band gap in comparison to the matrix materials, and is between the LUMOs and the HOMOs of the three matrix materials.

To the right in the scheme, the sum of the different energy levels is shown. A symbolizes the energy level at which the electron transport takes place; B symbolizes the energy level at which the hole transport takes place. d1 and d2 represent the energetic distances between the LUMOs of the first and second matrix materials (d1) and the HOMOs of the first and third matrix materials (d2). d3 symbolizes the band gap of the emitter material. If no emitter material is used, the layer may also be a charge carrier transport, charge carrier injection, or charge carrier blocking layer. Furthermore, several emitter materials can also be used. The emitter material has a concentration of ≤10 wt % in the emission layer.

Figure 3:
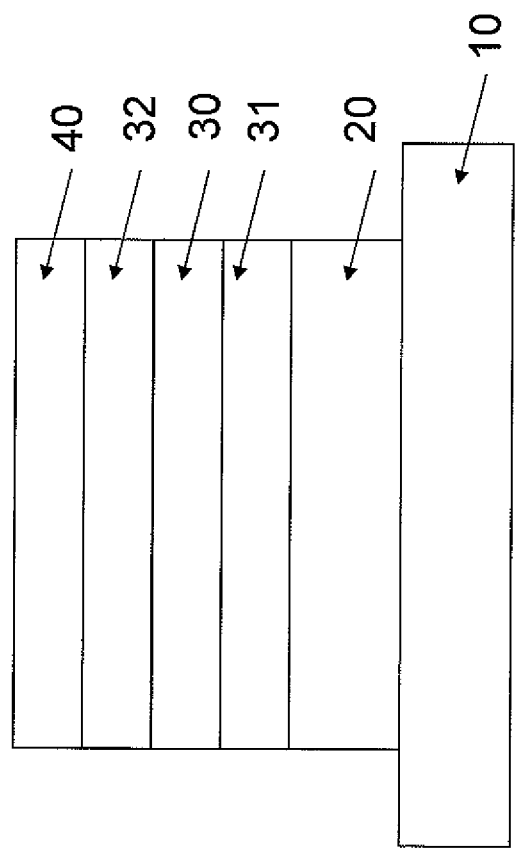
FIG. 3 shows a schematic side view of an electronic device.

FIG. 3 shows the schematic side view of another embodiment of the electronic device which has an emission layer 30 on one side on which border an electron transport layer 32 and a hole transport layer 31. The first electrode 20 is an anode. Both the emission layer 30 and also the electron transport layer 32 and the hole transport layer 31 can have matrices which are composed of three or more matrix materials.

Figure 4:
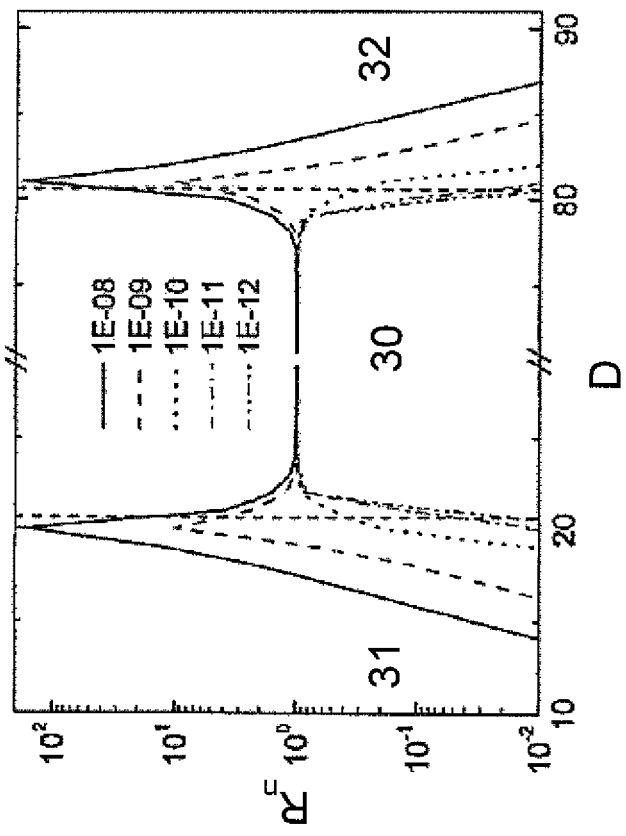
FIG. 4 shows the simulation of the mobility of the charge carrier in an emission layer.

FIG. 4 shows the simulation of the charge carrier transport in an OLED, in which an emission layer, a hole transport layer 31, and an electron transport layer 32 are present. The x axis shows the distance of the individual layer from the anode D [nm]; the y axis shows the standardized recombination rate Rn. One can see that with a reduction of the absolute value of the charge carrier mobility in the emission layer 30, in comparison to the hole transport layer 31 and the electron transport layer 32, the recombination zone is shifted from the borders of the emission layer to the middle. This means that with a declining mobility of the charge carrier in the emission layer 30, the recombination in the adjacent layer 32 and 31 is reduced and is shifted to the middle of the emission layer 30.

In the simulation, the electron and hole mobilities in the emission layer were equated—that is—an ambipolar charge transport is assumed. An ohmic injection was assumed; all energy barriers between HOMO and LUMO of the two layers were 400 meV for the individual charge carrier types. In the diagram, the individual mobilities of the charge carriers are indicated in m2/Vs for the various line forms; they fluctuate between 10-8 to 10-12.

Figure 5:
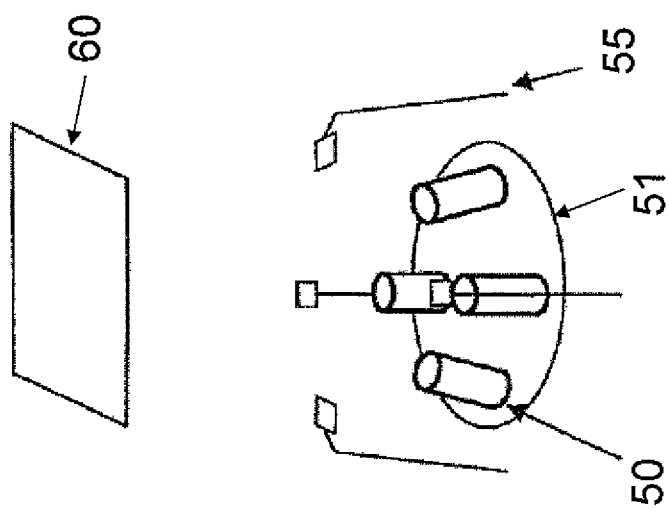
FIG. 5 shows the schematic structure of the production of a layer with several matrix materials.

FIG. 5 shows the schematic side view of a structure for the production of the electronic device. Four evaporation sources 50 are applied on a holder 51, for example, from which matrix materials and/or doping substances can be evaporated onto the deposition substrate 60. In order to be able to determine the individual concentration of the matrix material and/or the doping substances precisely, the evaporation rate is measured and adjusted via layer thickness monitors 55. The layer thickness monitors can be, for example, oscillator quartzes.

For example, with a structure according to FIG. 5, one can produce an emission layer which contains a first matrix material, which comprises mCP (m-bis(N-carbazolylbenzene)) and is applied at an evaporation rate of 3.8 Å/s. The second matrix material, the hole transport material, can be TCTA (9H-carbazole,9,9',9"-(1,3,5-benzenetriyl)tris-(9Cl)) and can be applied at an evaporation rate of 8 Å/s. The third matrix material, the electron transport material, can be, for example, TPBi (1,3,5-tris(N-phenylbenzylimidazol-2-yl) and can be applied at an evaporation rate of 8 Å/s. The yellow emitter rubrene (5,6,11,12-tetraphenylnaphtacene) can be introduced, for example, as the emitter material and can be applied at an evaporation rate of 0.2 Å/s. In this way, a layer with a volume concentration of 40% is produced for the charge carrier transport materials and 1%, for the emitter. The HOMOs and LUMOs of these materials are given in Table 1. The values of the HOMOs of TCTA, TPBi, mCP were determined by UV photoemission spectroscopy; the corresponding LUMO values were estimated in that the energy required for the absorption was added to the HOMO value. The HOMO and LUMO values of rubrene were determined by means of cyclovoltammetry and photoelectron spectrometry.

TABLE 1

|        | HOMO [eV] | LUMO [eV] |
|--------|-----------|-----------|
| mCP    | −5.9      | −2.4      |
| TCTA   | −5.7      | −2.3      |
| TPBi   | −6.3      | −2.8      |
| Rubren | −5.5      | −3.0      |

Key: 1 Rubrene

The third matrix material TPBi has the lowest LUMO value in comparison with the other matrix materials, and is thus the electron transport material. The second matrix material TCTA has the largest HOMO value, in comparison with the other matrix materials, and is thus the hole transport material. The first matrix material mCP does not participate in the charge carrier transport, since its LUMO is not lower than the LUMO of the third matrix material and its HOMO is not higher than the HOMO of the second matrix material.

Other possible hole transport materials are the following:
NPB N,N'-bis(naphthalen-1-yl)-N,N'-bis(phenyl)benzidine
TCTA 4,4',4"-tris(carbazol-9-yl)triphenylamine
CPB 4,4'-bis(carbazol-9-yl)biphenyl
1T-NATA 4,4',4"-tris(N-(1-naphthyl)-N-phenylamino)triphenylamine
Spiro-TAD 2,2',7,7'-tetrakis(N,N-diphenylamino)-9,9'-spirobifluorene As electron transport materials, the following can also be used:
TPBi 2,2',2"-(1,3,5-benzenetriyl)tris(1-phenyl-1-H-benzimidazole)
TAZ 3-(4-biphenyl)-4-phenyl-5-tert-butylphenyl-1,2,4-triazole
Alq3 tris(8-hydroxyquinolinato)aluminum
BCP 2,9-dimethyl-4,7-diphenyl-1,10-phenanthroline
NTAZ 4-(naphthalen-1-yl)-3,5-diphenyl-4H-1,2,4-triazole
Balq bis(2-methyl-8-quinolinolate)-4-(phenylphenolato)aluminum As the first matrix material that has the lowest charge carrier mobility in comparison to the other matrix materials, one can use the following:
UGH-2 1,4-bis(triphenylsilyl)benzene
UGH-3 1,3-bis(triphenylsilyl)benzene
mCP 1,3-bis(carbazol-9-yl)benzene The HOMOs of UGH-2 and UGH-3 have values of −7.2±0.1 eV; the LUMOs are 2.8 eV. These HOMO values can be determined by means of photoelectron spectroscopy; the LUMO values can be estimated from the distance from HOMO values and LUMO values at the intersection of the absorption and the fluorescence spectrum.

Possible emitter materials are the following
Ir(ppy)₃ tris(2-phenylpyridine)iridium(III)
Ir(ppy)₂ bis(2-phenylpyridine)(acetylacetonate)iridium(II) (acac)
BczVBi 4,4-bis(9-ethyl-3-carbazovinylene)-1,1'-biphenyl
FirPic bis(3,5-difluoro-2-(2-pyridyl)phenyl(2-carboxypyridyl)iridium(III)
Rubrene tetraphenyl naphthacene
Ir(piq)₃ tris(1-phenylisoquinoline)iridium(III)

These emitter materials are small nonpolymer molecules. The use of polymeric emitter materials is likewise possible.

Other possible materials, which, depending on the position of their HOMOs and LUMOs with respect to one another, can be used as the first, second, or third matrix, are the following:
Bphen 4,7-diphenyl-1,10-phenanthroline
DPAVBi 4,4'-bis(2-(4-(N,N-diphenylamino)phenyl)vinyl)biphenyl
CuPC Phthalocyanine copper complex
S-DPVBi 2,2',7,7'-tetrakis(2,2-diphenylvinyl)spiro-9,9'-bifluorene CPF
TAPC 1,1-bis(4-bis(4-methylphenyl)aminophenyl) cyclohexane
TBADN 9,10-bis(2-naphthyl)-2-t-butylanthracene
TPD N,N,N',N'-tetraphenyl benzidine Some of the electron and hole transport materials can also be used as the first matrix material. The relative ratio of the LUMOs and HOMOs of the three combined materials and their position to one another is important in the compilation of the first, second, and third matrix material for the matrix.

The matrix cannot be selected arbitrarily for phosphorescent emitters because of chemical compatibility. The red emitter iridium (III) bis(2-methyldibenzo[f,h]quinoxaline) acetylacetonate) is only efficient in an NBP matrix. NPB, however, is a hole transport material. If on the anode side, there is also another emitter layer, then this is not sufficiently supplied with electrons. By doping in an electron transport material, for example, BCP, the relative transport characteristics can be adjusted. The fine coordination of the transport characteristics takes place with UGH4.

The embodiments shown in the figures and embodiment examples can be arbitrarily varied. It should also be taken into consideration that the invention is not limited to the examples, but rather permits other developments not listed here.

The invention claimed is:

1. An electronic device, comprising:
   a substrate;
   a first electrode;
   at least one organic functional layer; and
   a second electrode, wherein the at least one organic functional layer is located between the first electrode and the second electrode, and wherein the at least one organic functional layer has at least a first matrix material, a second matrix material, and a third matrix material, and the third matrix material has a Lowest Unoccupied Molecular Orbital (LUMO), which is energetically lower than the LUMO of the second matrix material and the LUMO of the first matrix material, and wherein the second matrix material has a Highest Occupied Molecular Orbital (HOMO), which is energetically higher than the HOMO of the first matrix material and the HOMO of the third matrix material,
   wherein the organic functional layer is an emission layer and is doped with at least one emitter material.

2. The electronic device according to claim 1, wherein the first matrix material has a LUMO which is energetically higher than the LUMO of the second matrix material and the LUMO of the third matrix material, and a HOMO which is energetically lower than the HOMO of the second matrix material and the HOMO of the third matrix material.

3. The electronic device according to claim 1, wherein the second matrix material has a LUMO which is energetically higher than the LUMO of the third matrix material, and a HOMO which is energetically higher than the HOMO of the third matrix material.

4. The electronic device according to claim 1, wherein the first matrix material has a charge carrier mobility which is lower than the charge carrier mobilities of the second and third matrix materials.

5. The electronic device according to claim 1, wherein the second matrix material comprises a hole transport material.

6. The electronic device according to claim 1 wherein the third matrix material comprises an electron transport material.

7. The electronic device according to claim 1, wherein the organic functional layer is selected from a group which comprises emission layers, electron transport layers, hole transport layers, electron blocking layers, hole blocking layers, hole injection layers, electron injection layers, and intermediate layers.

8. The electronic device according to claim 1, wherein the emitter material in the emission layer has a concentration of ≤10 wt %.

9. The electronic device according claim 1, wherein the concentration of the emitter material in the emission layer has a gradient.

10. The electronic device according to claim 1, wherein the LUMO of the emitter material is energetically lower than the LUMO of the first, second, and third matrix materials, and the HOMO of the emitter material is energetically higher than the HOMO of the first, second, and third matrix materials.

11. The electronic device according to claim 1, which is constructed as a radiation-emitting device.

12. The electronic device according to claim 1, wherein the device is selected from a group which comprises an organic light-emitting device, a solar cell, and a transistor.

13. A method for the production of an electronic device according to claim 1, comprising the steps of:
   A) preparation of a substrate;
   B) preparation of a first electrode and a second electrode; and
   C) placement of at least one organic functional layer between the first electrode and the second electrode,
   wherein in method step C), at least the first matrix material, the second matrix material, and the third matrix material are simultaneously applied.

14. A method according to claim 13, wherein in the method step C), the first matrix material, the second matrix material, and the third matrix material are applied by evaporation coating.

15. An electronic device, comprising:
   a substrate;
   a first electrode;
   at least one organic functional layer; and
   a second electrode, wherein the at least one organic functional layer is located between the first electrode and the second electrode, and wherein the at least one organic functional layer has at least a first matrix material, a second matrix material, and a third matrix material, and the third matrix material has a Lowest Unoccupied Molecular Orbital (LUMO), which is energetically lower than the LUMO of the second matrix material and the LUMO of the first matrix material, and wherein the second matrix material has a Highest Occupied Molecular Orbital (HOMO), which is energetically higher than the HOMO of the first matrix material and the HOMO of the third matrix material,
   wherein the first matrix matrial has a LUMO which is energetically higher than the LUMO of the second matrix material and the LUMO of the third matrix material, and a HOMO which is energetically lower than the HOMO of the second matrix material and the HOMO of the third matrix material.

16. An electronic device, comprising:
   a substrate;
   a first electrode;
   at least one organic functional layer; and
   a second electrode, wherein the at least one organic functional layer is located between the first electrode and the second electrode, and wherein the at least one organic functional layer has at least a first matrix material, a second matrix material, and a third matrix material, and the third matrix material has a Lowest Unoccupied Molecular Orbital (LUMO), which is energetically lower than the LUMO of the second matrix material and the LUMO of the first matrix material, and wherein the second matrix material has a Highest Occupied Molecular Orbital (HOMO), which is energetically higher than the HOMO of the first matrix material and the HOMO of the third matrix material,
   wherein the first matrix material has a charge carrier mobility which is lower than the charge carrier mobilities of the second and third matrix materials.

* * * * *